(12) United States Patent
MacNeil et al.

(10) Patent No.: US 6,652,706 B1
(45) Date of Patent: Nov. 25, 2003

(54) TAPE FEEDER WITH IMPROVED COVER TAPE DISPOSITION PATH AND DRIVE

(75) Inventors: Sean E. MacNeil, Hilton, NY (US); John DeLorme, Spencerport, NY (US); Raymond Bray, Honeoye Falls, NY (US)

(73) Assignee: Delaware Capital Formation, Inc., Wilmington, DE (US)

( * ) Notice: Subject to any disclaimer, the term of this patent is extended or adjusted under 35 U.S.C. 154(b) by 52 days.

(21) Appl. No.: 09/996,709

(22) Filed: Nov. 30, 2001

Related U.S. Application Data (60) Provisional application No. 60/250,670, filed on Dec. 1, 2000.

(51) Int. Cl.[7] .............................. B32B 35/00; B65H 5/28
(52) U.S. Cl. ..................... 156/344; 156/584; 221/25; 221/72; 221/87; 414/411; 414/416
(58) Field of Search .............................. 156/344, 584; 221/25, 72, 73, 79, 87; 226/8, 120, 139; 414/411, 416, 425

(56) References Cited

U.S. PATENT DOCUMENTS

| 4,586,670 A | * | 5/1986 | Vancelette et al. ........... 156/584 |
| 4,820,369 A | * | 4/1989 | Kubo .......................... 156/344 |
| 4,944,979 A | | 7/1990 | Gagliano et al. |
| 5,024,720 A | | 6/1991 | Boss et al. |
| 5,213,653 A | * | 5/1993 | Akahori et al. .............. 156/584 |
| 6,077,022 A | * | 6/2000 | Gfeller et al. ........... 414/416.01 |
| 6,162,007 A | * | 12/2000 | Witte ..................... 414/416.01 |

FOREIGN PATENT DOCUMENTS

| EP | 0859541 A2 | 8/1998 |
| EP | 0859542 A2 | 8/1998 |
| EP | 0859543 A2 | 8/1998 |
| EP | 0859544 A2 | 8/1998 |

* cited by examiner

*Primary Examiner*—Mark A. Osele
(74) *Attorney, Agent, or Firm*—Basch & Nickerson LLP; Duane C. Basch (57) ABSTRACT

The present invention is a method and apparatus for supplying components, via a carrier tape having a cover tape thereon and a plurality of pockets retaining components therein, for retrieval by an automated insertion machine, including a carrier tape reel support, a tape feed path with a peel edge, about which to peel the cover tape from the carrier tape prior to the component being presented for retrieval at the pick location, and a cover tape path preferably having a V-bar and O-ring drive system for directing the travel of the cover tape in a rearward and downward direction to facilitate disposal beneath the tape feeder. Such a system provides a cover tape disposal path that enables the use of spliceable carrier tapes on such feeders.

13 Claims, 11 Drawing Sheets

TAPE FEEDER WITH IMPROVED COVER TAPE DISPOSITION PATH AND DRIVE

CROSS REFERENCE

The following related applications are hereby incorporated by reference for their teachings:

"SPLICEABLE TAPE FEEDER WITH AN IMPROVED COVER TAPE PATH AND COVER TAPE DRIVE," a U.S. Provisional Application for Patent by Sean E. MacNeil et al., 60/250,670, filed Dec. 1, 2000.

This invention relates generally to the manufacturing of printed circuit board assemblies (PCBAs) and electronic components, and more particularly to a component tape feeder having splicing capabilities and a cover tape drive for reliably conveying a cover tape removed from an upper surface thereof.

BACKGROUND AND SUMMARY OF THE INVENTION

The present invention is a spliceable tape feeder device for not only conveying components to a pickup location for attachment to a substrate using a pick and place machine, but also for reliably controlling the cover tape peeled therefrom to direct it toward a downward disposal location. Carrier tape used in tape feeding equipment typically comprises a plastic, paper or similar strip having depressions at regular intervals containing the part to be mounted on the substrate and a second, plastic cover tape covering the depressions to retain the components in the depressions during transport and use. Such tapes are generally of a limited length that is determined by the size of the components and the capacity of the supply reel that contains the components. However, this invention relates to a tape feeder device that can feed such carrier tapes in a variety of formats, wherein the feeder incorporates certain functions and features that enable splicing of the carrier tape from one reel to another, where the need to remove the feeder from the pick-and-place system is eliminated.

The preferred method for the automated construction of circuit boards requires the use of high speed pick and place machines that pick components from a feeder having a pickup location and place them at required locations on a printed circuit board for attachment. Pick and place machines rely on feeding mechanisms or feeders to reliably feed the required components to the expected pickup location. It is well-known in the industry to package small electronic components such as integrated circuit chips in a carrier tape that is characterized by a flexible strip with depressions formed at regular intervals along its length. A part is disposed in each depression and secured by a cover tape that is adhered along its edges to the carrier tape. Components that are packaged in a carrier tape require the cover tape be peeled away from the carrier tape and that the carrier tape be advanced to bring the next part to the pickup location. Normally, the cover tape is peeled back from the carrier tape at a point just prior to the pick location as the tape is advanced. In systems that are intended to enable spliceable feeding, the handling of the cover tape, after being peeled back from the carrier tape, is an important consideration. More specifically, it is important that such a feeder provides means for continual disposal of cover tape from an unlimited number of carrier tape feed reels.

Electronic components are packaged in carrier tapes in a variety of formats, depending on the size of the part being delivered. In particular, carrier tapes are available in varying widths and pitches. The width is the distance from edge to edge perpendicular to the length of the tape. Widths common in the industry are 8 millimeters to 56 millimeters and larger. The pitch of a carrier tape is the distance from one depression (e.g. lead edge) to the next (lead edge) along the length of the tape. Carrier tapes are generally wound on reels and transported to the automated assembly location. It is obvious that the part manufacturer and user will desire to use the smallest pitch tape permissible for the size of the electronic component in order to reduce the length of the tape required, and thereby reducing the size and/or number of reels for the required task.

Heretofore, a number of patents and publications have disclosed aspects of a cover tape feeding system, the relevant portions of which may be briefly summarized as follows:

Foreign Patent Publications EP0859541A2, EP0859542A2, EP0859543A2, EP0859544A2, by M. Gfeller et al. (Zevatech Trading AG) filed Feb. 12, 1998 and claiming a priority date of Feb. 18, 1997, the teachings of which are hereby incorporated by reference.

In accordance with the present invention, there is provided an apparatus for supplying components, via a carrier tape having a cover tape thereon and a plurality of pockets retaining components therein, for retrieval by an automated insertion machine, comprising: a carrier tape reel support; a tape feed path and associated tape drive for sequentially positioning the carrier tape so that the components therein may be retrieved at a pick location; a peel edge, about which to peel the cover tape from the carrier tape prior to the component being presented for retrieval at the pick location; and a cover tape path for controlling the travel of the cover tape in a rearward and downward direction so that the cover tape may be disposed of beneath the tape feed path.

In accordance with another aspect of the present invention, there is provided a method of supplying components with a tape feeder, via a carrier tape having a cover tape thereon and a plurality of pockets retaining components therein, for retrieval by an automated insertion machine, comprising the steps of: supplying a spliceable source of the carrier tape; sequentially advancing the carrier tape, with a tape drive, so that the components therein may be retrieved at a pick location; removing the cover tape from the carrier tape at a peel edge prior to the component being advanced to the pick location; and controlling the travel of the cover tape in a rearward and downward direction using a V-bar assembly to alter the direction and a friction tape drive, wherein the cover tape first passes through the V-bar assembly to alter its direction of travel so as to be disposed of beneath the tape feeder.

In accordance with yet another aspect of the present invention, there is provided an apparatus for supplying components, via a carrier tape having a cover tape thereon and a plurality of pockets retaining components therein, for retrieval by an automated insertion machine, comprising a peel edge, about which to peel the cover tape from the carrier tape prior to the component being presented for retrieval at the pick location; and a cover tape drive including a lid having a knurled idler roller associated therewith, a motor, and a rotating drive shaft, coupled to said motor and positioned so that the end thereof extends to the center of the idler roller when the lid is closed, and where said drive shaft includes an O-ring mounted on the end thereof so that said O-ring contacts a surface of the cover tape and imparts a frictional drive force to the cover tape to move it through the cover tape drive.

In accordance with a further aspect of the present invention, there is provided an apparatus for guiding a cover tape, comprising: a rod oriented in a generally horizontal plane and angled with respect to a path of the cover tape; and a roller operatively associated with said rod, where said rod and roller are maintained in a pre-determined relationship as they pivot about a generally vertical axis to facilitate the threading of cover tape therethrough.

One aspect of the invention is based on the discovery that prior-art cover tape paths and drive mechanisms are prone to problems during operation, including varying cover tape travel paths and cover tape drive elements that quickly become covered with adhesive transferred from the cover tape. This discovery avoids problems that arise from the handling of the cover tape once it is removed from the surface of the carrier tape.

This aspect is further based on the discovery of techniques that afford easy service or cleaning of the cover tape path and drive mechanism so as to avoid the need for costly repair or replacement of parts along the cover tape path. This aspect of the invention can be implemented, for example, by a pivotable V-bar assembly that facilitates threading of the cover tape and a cover tape drive having an O-ring drive roller driving the cover tape along a central region between the adhesive-covered edges and causing the cover tape to crown slightly to increase its beam strength. The increased beam strength in turn results in the tape continuing to travel in the direction in which it is driven.

The techniques described herein are advantageous because they are both simple to implement and are highly reliable compared to other approaches. The improved drive path further improves the ease of threading the cover tape in the present system. In addition, it can be used in non-splicing feeders to facilitate improved cover tape handling and disposal to a cover tape receptacle beneath the feeder. The techniques of the invention are advantageous because they provide a range of alternatives, each of which is useful in appropriate situations and permit efficient handling of cover tape, particularly for spliceable feeders where the cover tape stream become essentially endless. As a result of the invention, cover tape handling is improved so as to further enable the consideration and development of fully spliceable component tape feeding systems.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the present invention, reference is made to the drawings. In the drawings, like reference numerals have been used throughout to designate identical elements. In describing the present invention, the following term(s) have been used in the description.

"Component" is used to represent any of a number of various elements that may be automatically retrieved and applied to a printed circuit board assembly (PCBA). "Carrier tape" is intended to represent a component feeding tape having at least a component tape or base layer with punched or embedded pockets in which the components are carried, and a cover tape layer thereover to retain the components within the pockets during transport and use of the tape. Carrier tapes come in various widths, depending upon component size and are typically in the range of 8 to 56 mm. The parallel edges of the cover tape are affixed to the carrier layer using an-adhesive or thermal process so that the cover tape generally remains attached to the carrier layer when the component carrier tape is wound on a reel for ease of transportation and use. As noted above, the carrier tapes also come in multiple pitches.

Figure 1:
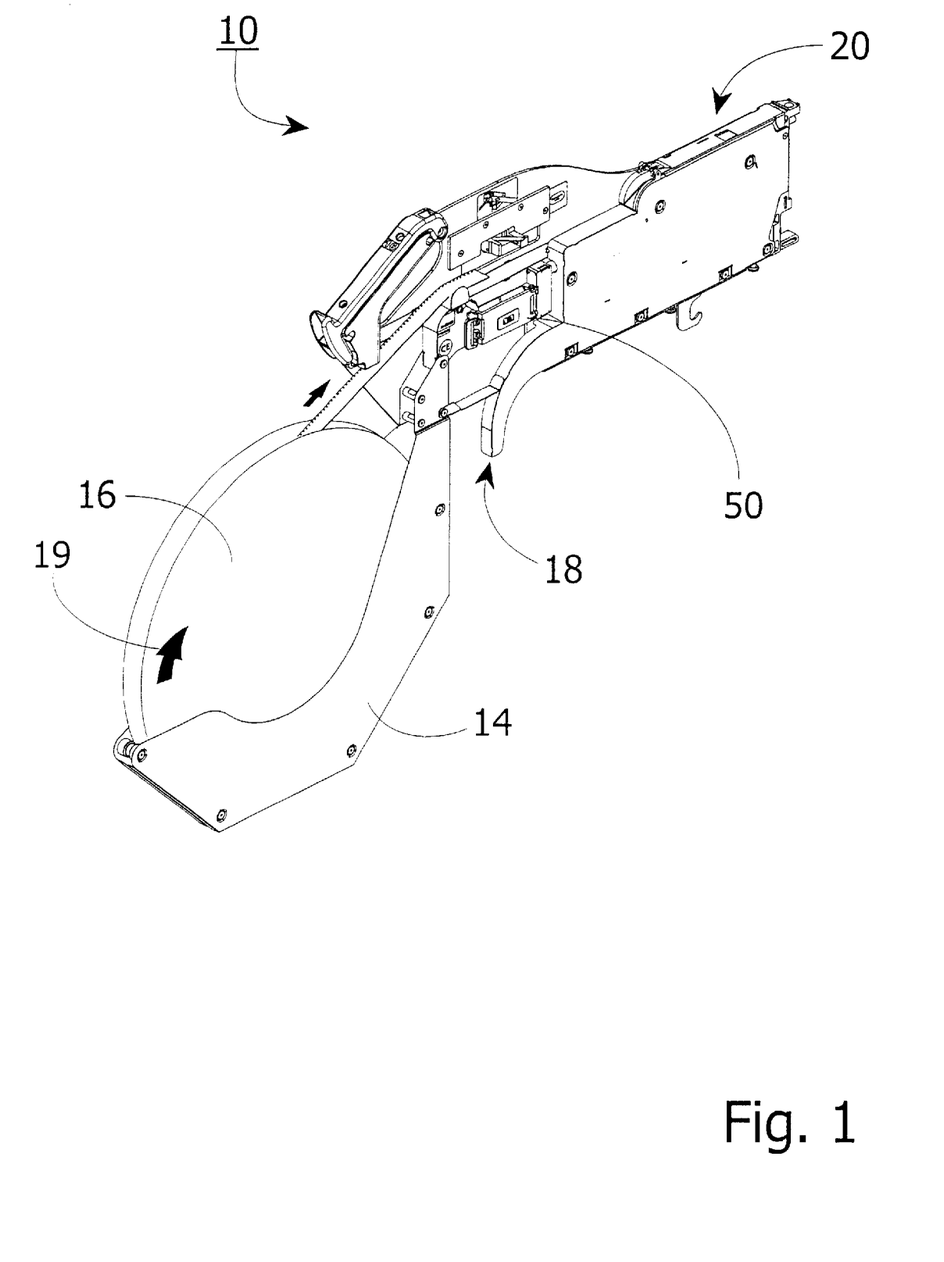
FIG. 1 is a perspective view of a component tape feeder that provides an exemplary embodiment for the present invention.

Referring to FIG. 1, there is shown a perspective view of a spliceable feeder 10 as would be inserted into a pick-and-place assembly system (not shown). As will be appreciated by those familiar with tape feeders and automated assembly systems, it is common to utilize a plurality of tape feeders positioned adjacent one another in the receiving interface so as to permit the feeding and assembly of a plurality of components onto the printed circuit boards. It will be further appreciated that a spliceable feeder will reduce the need to remove the feeder from the assembly system, and will thereby reduce the overall cost of operating such a system.

Feeder 10 preferably includes a carrier tape support 14 in the form of a "basket" for supporting a carrier tape reel 16 and allowing it to rotate in the direction indicated by arrow 19. Tape from reel 16 is fed through a tape path in the body 18 of the feeder. Ultimately, the carrier tape is fed through a tape window at pick location 20, where the cover tape is peeled away and the carrier tape is advanced so that components may be removed therefrom.

Figure 9:
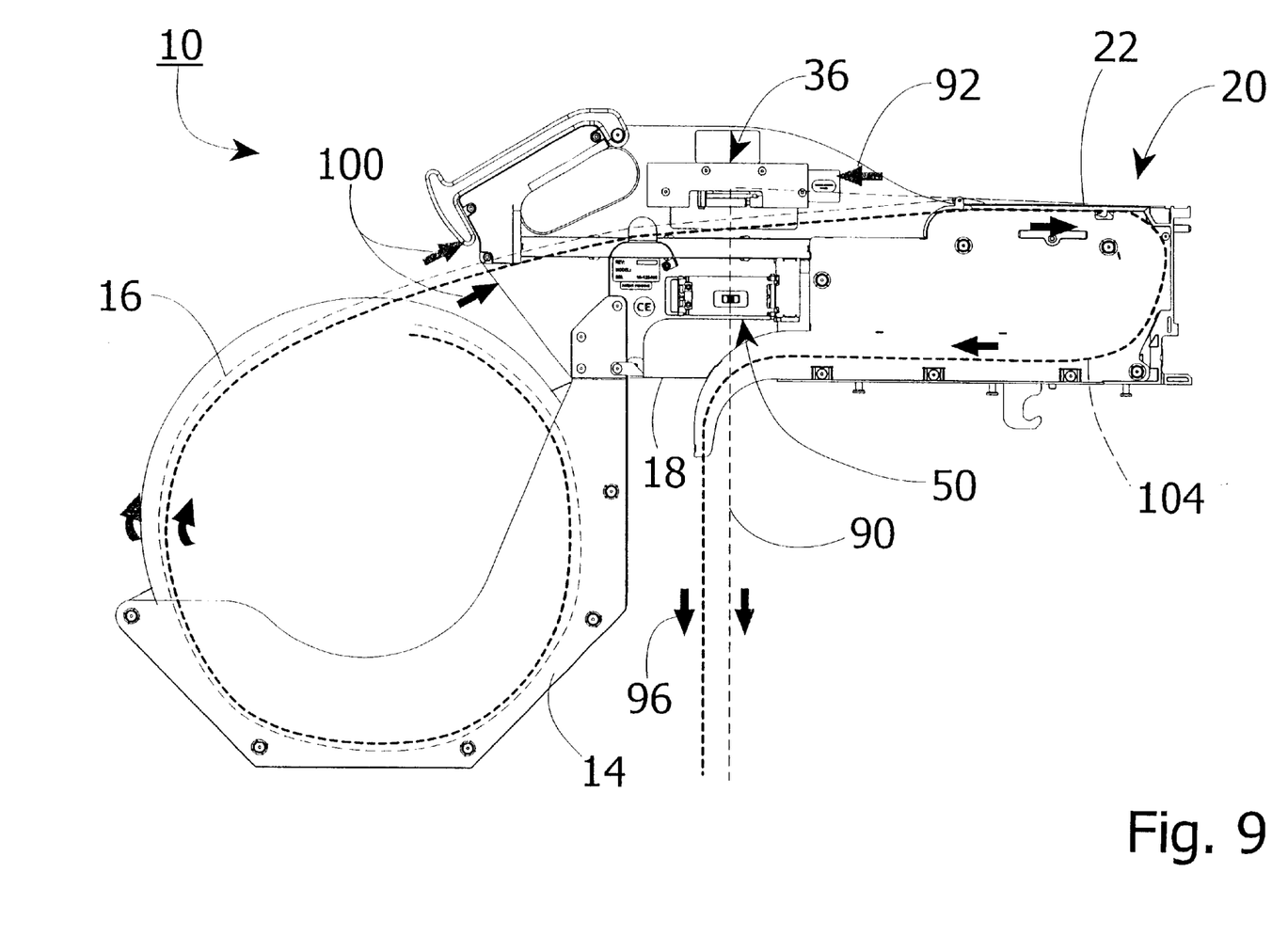
FIG. 9 is a detailed illustration of the carrier tape and cover tape paths in the feeder of FIG. 1.

While in conventional feeder systems, the cover tape is then wound about a take-up reel, the present invention employs an alternate cover tape path and drive assembly. Referring briefly to FIG. 9, there is depicted a cover tape path represented by smaller dashed line 90, that illustrates the preferred configuration. In particular, once the cover tape is peeled about peel edge 22 as the carrier tape is advanced, the cover tape travels toward the rear of the feeder 10 in the direction indicated by arrow 92 until it reaches V-bar assembly 36 and is pulled so as to be redirected in the downward direction indicated by arrow 96 through the splice drive 50. In accordance with an aspect of the present invention, the essentially limitless cover tape (in a spliceable feeder) may then be disposed in a common manner with the carrier tape base (including cutting, chopping, compressing, rewinding, etc.) by access to a bin or other disposal means (not shown) on the lower side of body 18 while the feeder continues uninterrupted operation. Such a system provides a cover tape disposal path that enables the use of spliceable carrier tapes on such feeders.

Figure 2:
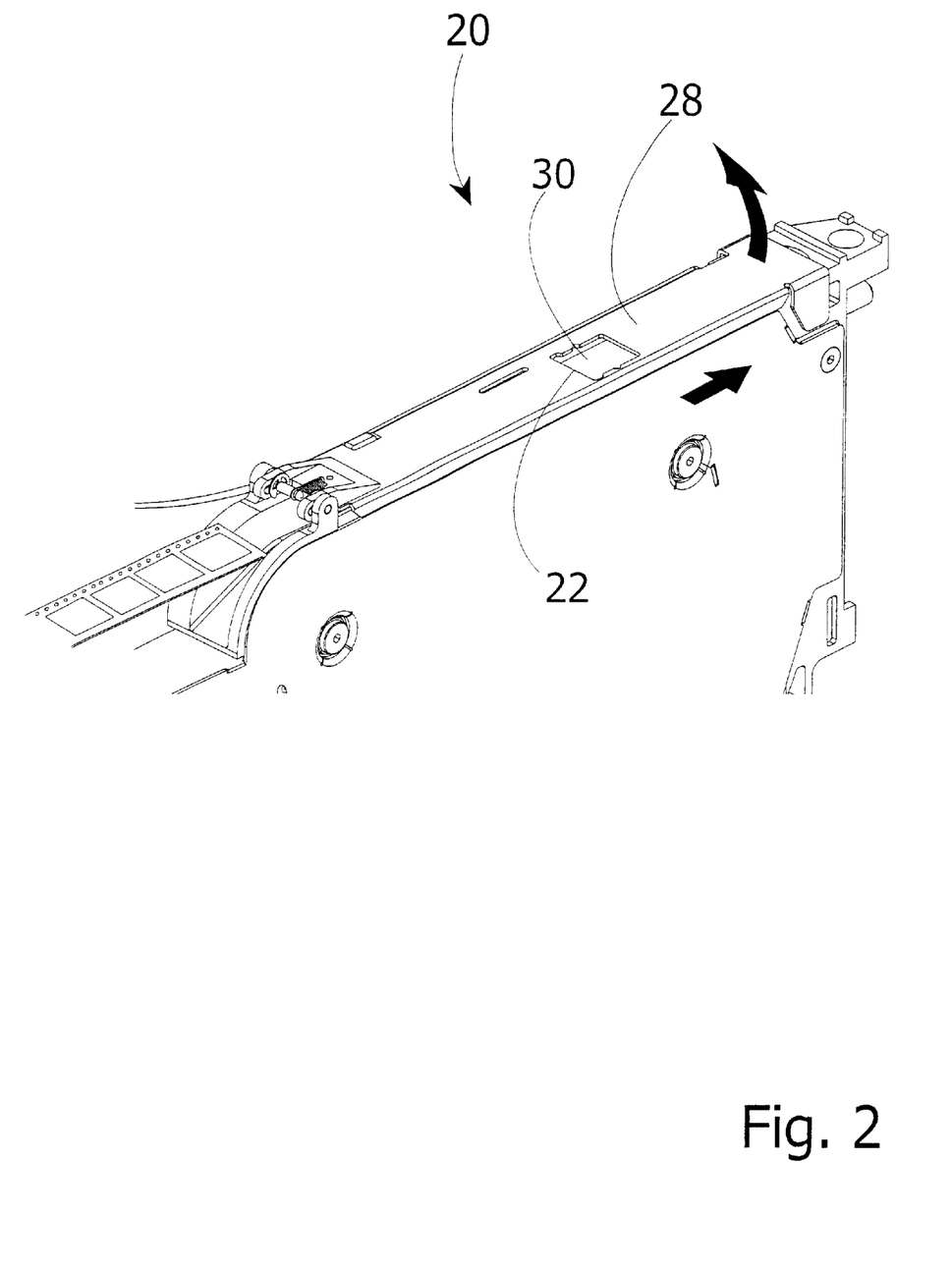
FIG. 2 and are detailed illustrations of the pick location of the feeder of FIG. 1.
Figure 3:
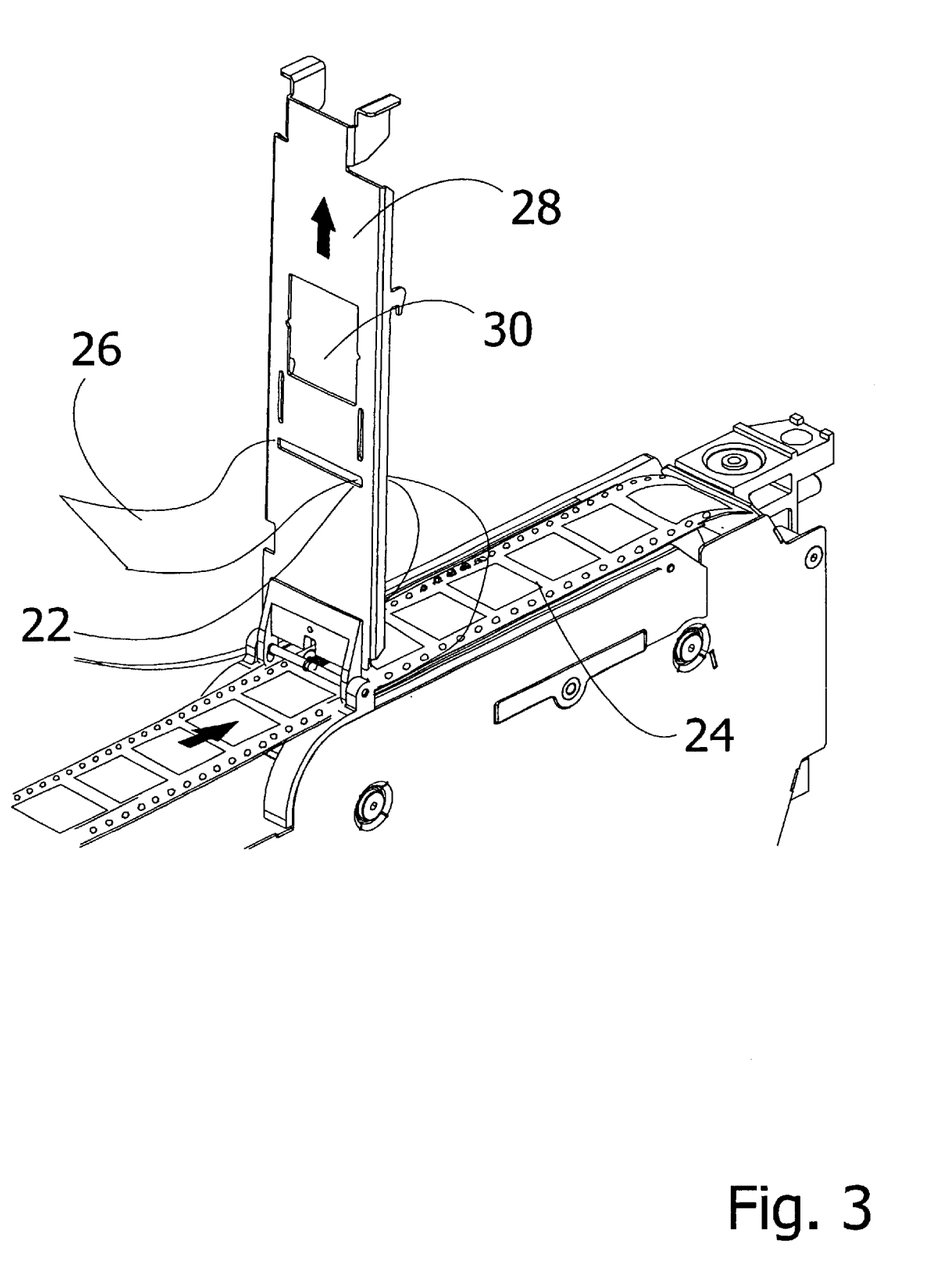
FIG. 3 is a perspective view of the tape window shown in the cover tape loading position.

Referring to FIGS. 2 and 3, there is illustrated a pick location 20 having a tape window region 28 and an adjacent peel edge 22 employed to strip the cover tape 26 from the surface of the carrier tape 24 just prior to the component carried within the carrier tape reaching the window in pick location 20 as defined by the tape window. To be placed in use, the moveable tape window is unlocked and opened as shown in FIG. 3, the carrier tape is advanced toward the pick location and a short segment of cover tape is then manually peeled away from the carrier tape. The cover tape 26 is then "threaded" through the aperture 30 having a peel edge 22 along one side thereof. The lead edge of cover tape 26 is then further fed along the path that is further described with respect to FIG. 9.

Figure 4A:
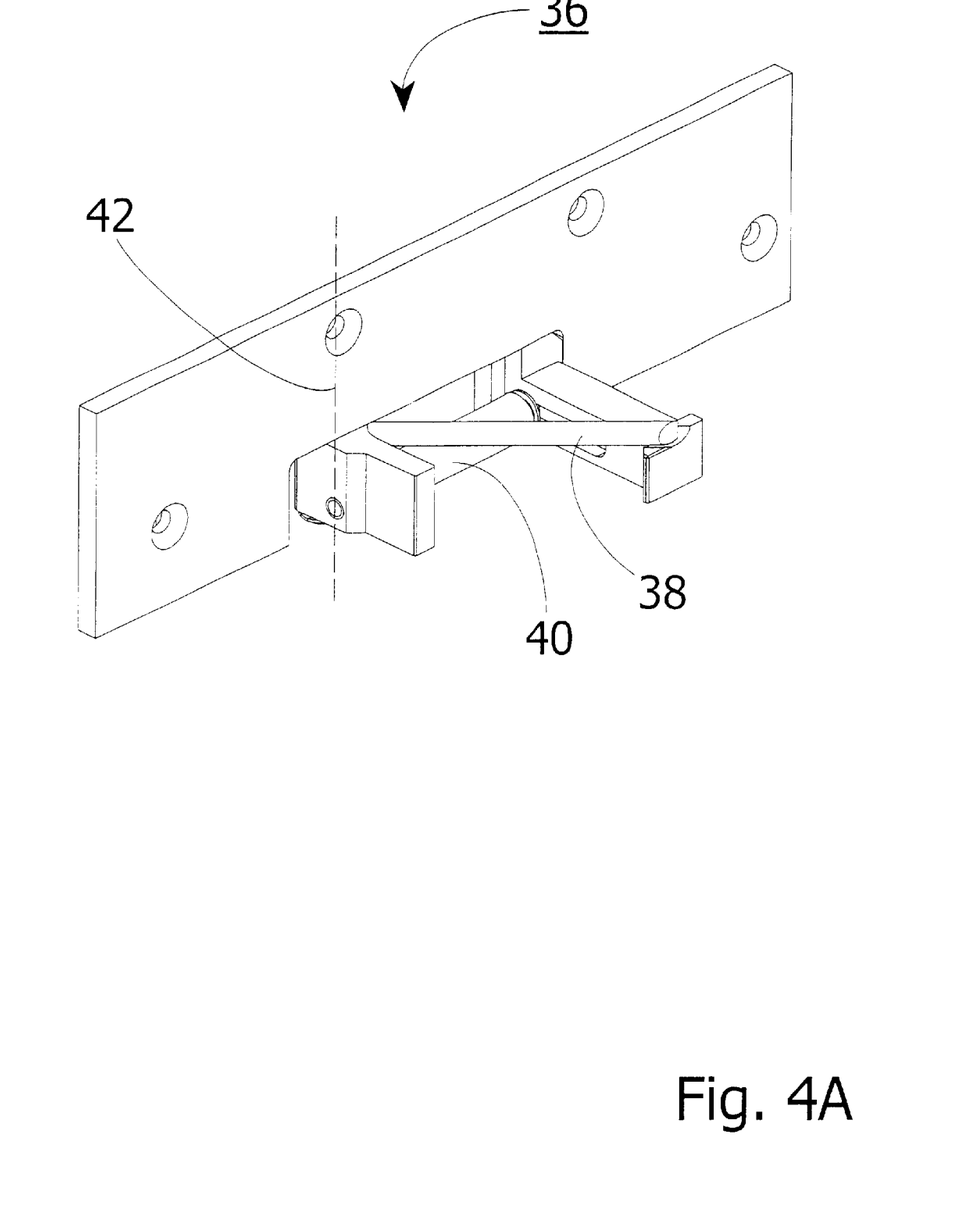
FIGS. 4A–4C are pictorial views of the pivotable V-bar assembly of the present invention in various configurations.
Figure 4B:
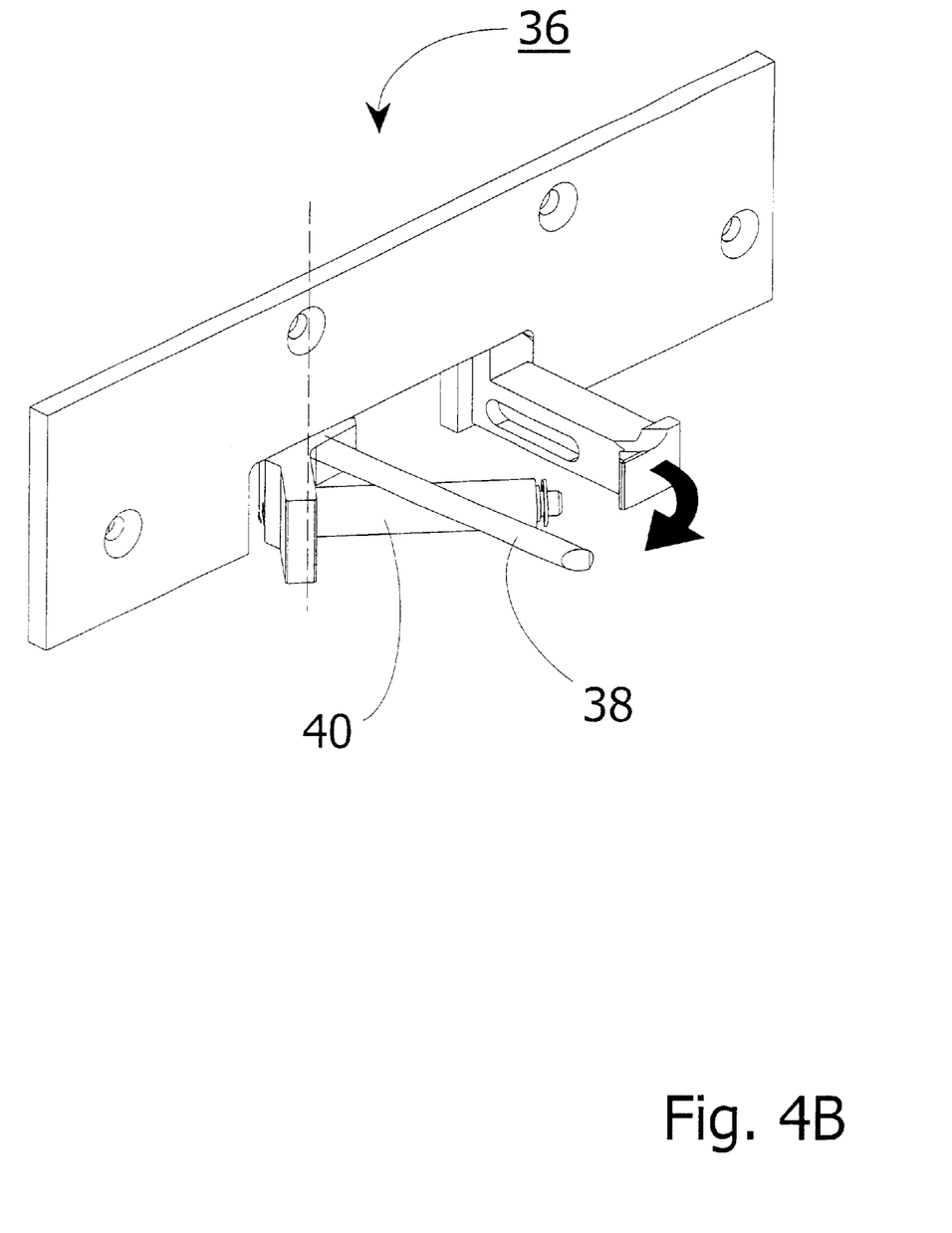
Figure 4C:
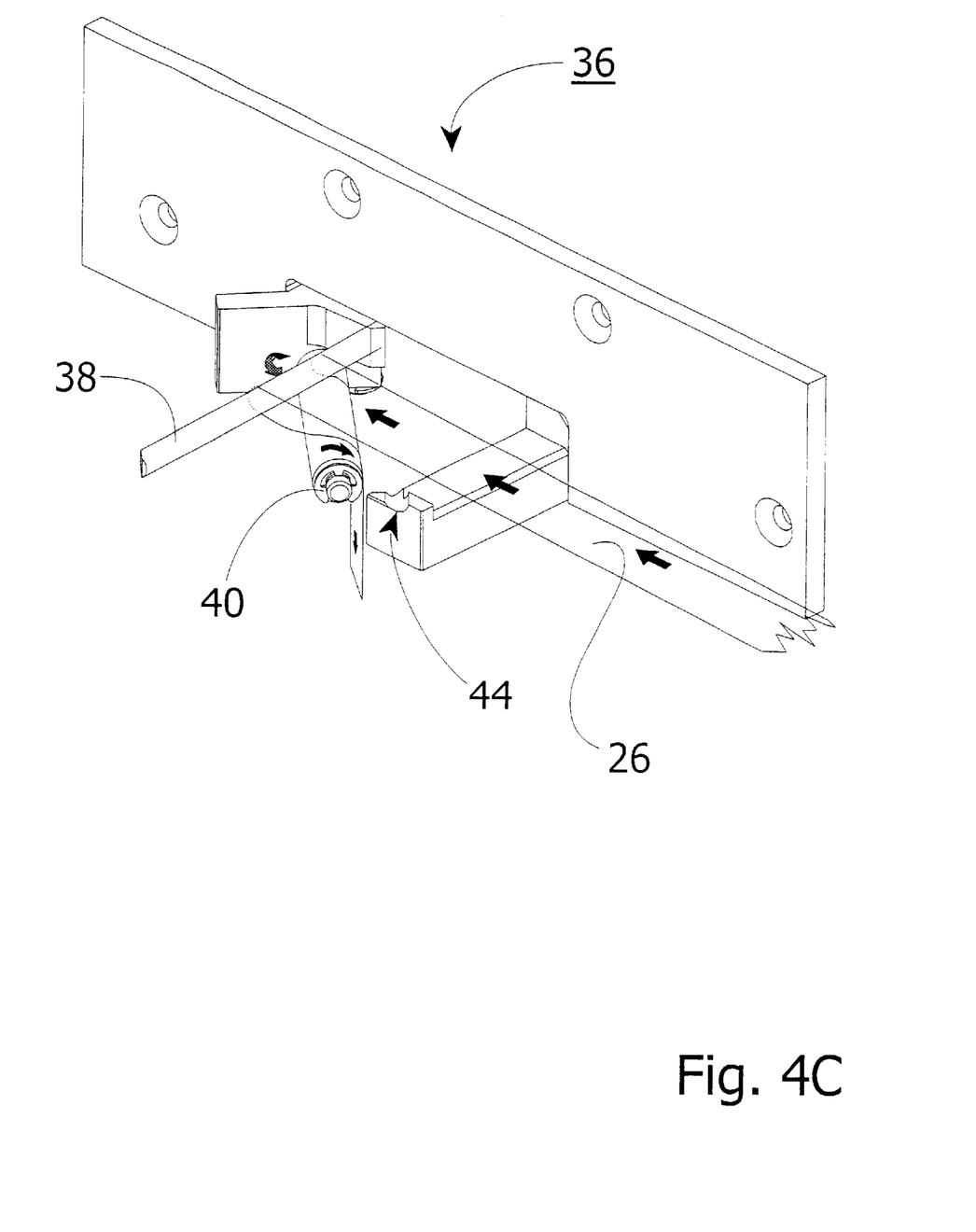

Once the carrier and cover tape elements are threaded into their respective positions, the tape window is closed, as indicated in FIG. 2, so that components will be presented at the pick location, in seriatim, as the carrier tape is advanced. Turning to FIGS. 4A–4C, the carrier tape 26 is preferably fed through a means for changing the direction of the tape. While numerous alternatives may be employed to alter the cover tape direction, the present invention utilizes a pivotable V-bar assembly 36 as depicted in the figures. More specifically, other alternatives include a 45-degree roller such as disclosed in the Zevatech publications cited above, or a crescent-shaped slot or similar aperture positioned within the path at approximately a 45-degree angle relative to the plane of the cover tape. However, the pivotable V-bar assembly is believed to be preferred as it facilitates without having to feed the loose end thereof through a hole or aperture.

As indicated in FIGS. 4A–4C, the V-bar assembly 36 comprises an angled rod 38 and a roller 40, where the rod and roller are maintained in a pre-determined relationship even as they pivot about axis 42. In use, the V-bar assembly is first swung to the open position indicated in FIGS. 4B and 4C, where the tape is preferably inserted so that the tape goes over the rod 38 and then under and around roller 40. The adhesive side of the cover tape (the lower side when connected to the carrier tape) faces upward and away from bar 38 and toward roller 40. When the V-bar assembly is closed by pivoting it about axis 42, as depicted in FIG. 4A, the rod 38 seats in notch 44 and the adhesive side of the cover tape will face the operator. It will also be appreciated that alternative arrangements for the rod and roller may be employed so as to accomplish the directional change of the tape. However, the embodiment depicted is believed to be preferred as it results in an easier to thread apparatus, and one that allows the cover tape to pass behind the advancing carrier tape immediately below.

Once the cover tape has been threaded through the V-bar assembly, it is then passed along the back side of the advancing carrier tape (between the carrier tape and the rear plate of body 18) and through an opened cover tape drive 50. Cover tape drive 50, the details of which are depicted in the assembly drawing of FIG. 5, includes a lid 52 having an idler roll assembly 64 incorporated therein. Lid 52 is pivotably affixed to drive assembly 56, which in turn is operatively associated with base 58. Lid 52 is comprised of a plastic frame 60 (e.g., molded) that includes an aperture for receiving idler roll assembly 64 therein. The idler roll assembly comprises an idler roller, which may be a knurled roller, or a roller that has an otherwise non-cylindrical outer surface, depending upon the preferred operation of the idler. For example, the surface may be concave over at least a portion of its cover tape contact region so as to facilitate improved tracking. Furthermore, in the embodiment depicted, the roller is not only knurled along portions thereof, but also includes a groove or flat region 66 in the center thereof, where the groove is aligned with an O-ring drive when the splice drive 50 is assembled. Idler roll assembly 64 may further include a stripper 55 (FIG. 7) or similar mechanism that facilitates the removal of the cover tape from the idler roller on the lower or exit side of the nip formed between the idler roller and the O-ring 86.

Figure 5:
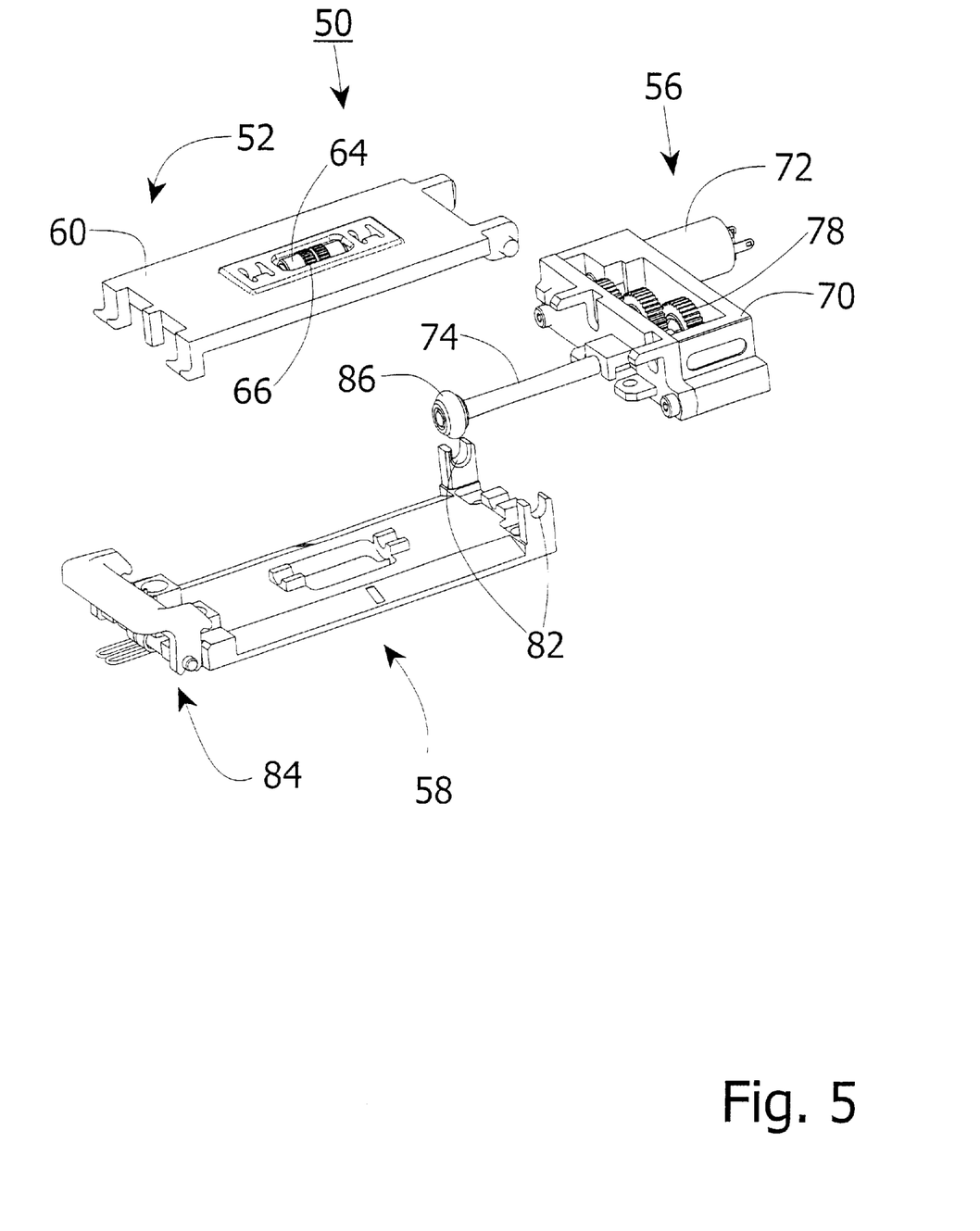
FIGS. 5–8 are detailed illustrations of the novel cover tape drive employed in accordance with an aspect of the present invention to drive the cover tape.

Drive assembly 56 includes a frame or housing 70 that houses a cover tape drive motor 72 and reduction gear assembly 78 that is connected to the drive shaft 74. Drive shaft 74 is maintained in position by a bearing block (not shown) so that the engagement of drive motor 72 results in the rotation of the drive shaft and O-ring 86 in a clockwise direction as it is depicted in FIG. 5. Base 58 further includes hinge pivot mounts 82 on one end and a spring-loaded latch 84 on the opposite end to releasably engage the end of lid 52.

Figure 7:
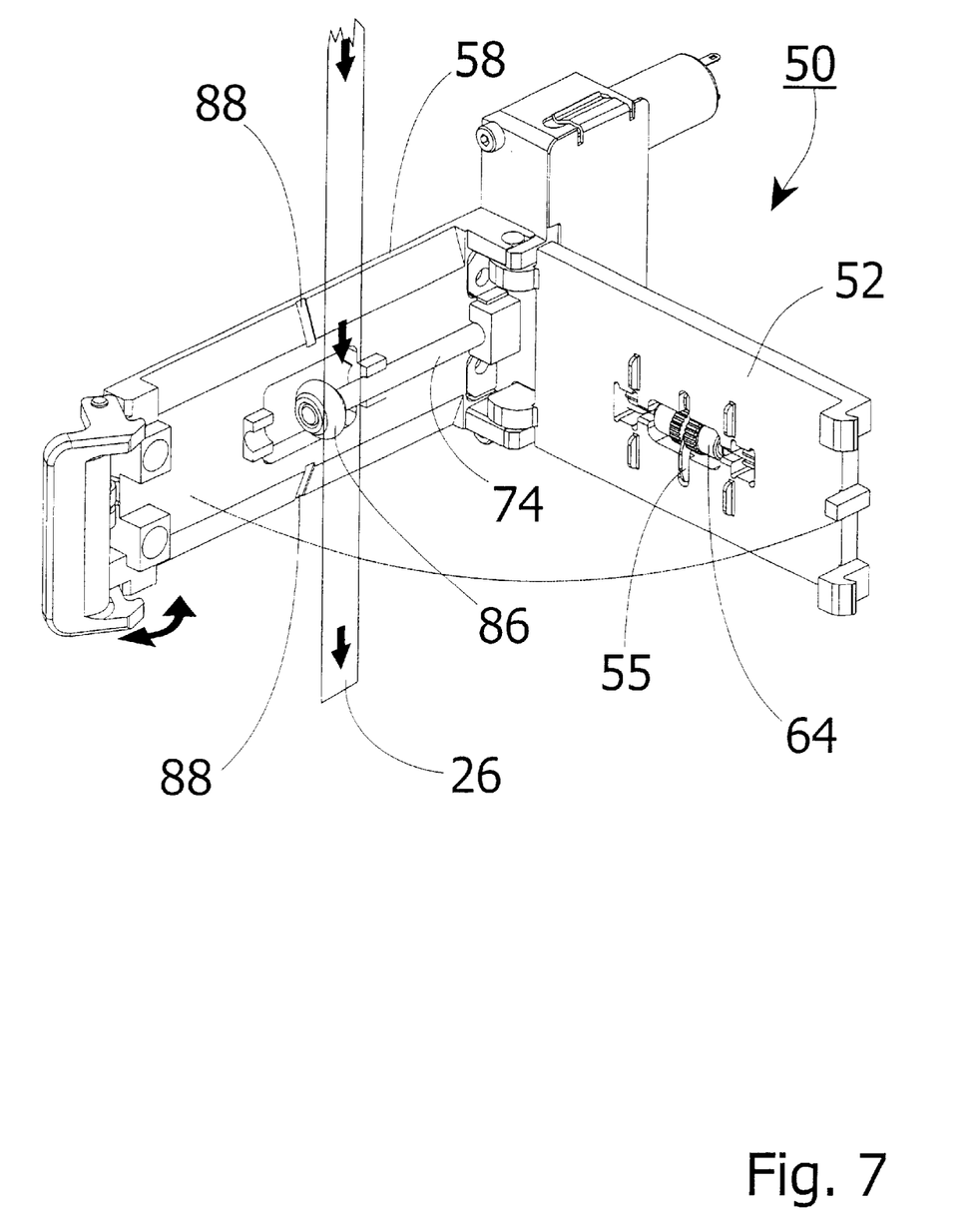

As will be further appreciated from a review of FIGS. 5 and 7, the O-ring 86 may be easily removed from the end of the half-length drive shaft 74. The half-length shaft does not require dis-assembly in order to replace or clean the O-ring. Hence, the O-ring may be easily replaced by an operator. Similarly, because the O-ring is aligned with the grove on the knurled idler roll, the cover tape is driven by frictional contact with a non-adhesive portion of the tape. Driving the tape in this manner reduces the amount of residual adhesive that is transferred from the cover tape to the idler roller (or the O-ring if an alternative tape orientation used). In addition, the beam strength of the tape that results from the concavity imposed by the O-ring and idler are further believed to assist with directing the tape to a disposal region below the drive nip.

Figure 6:
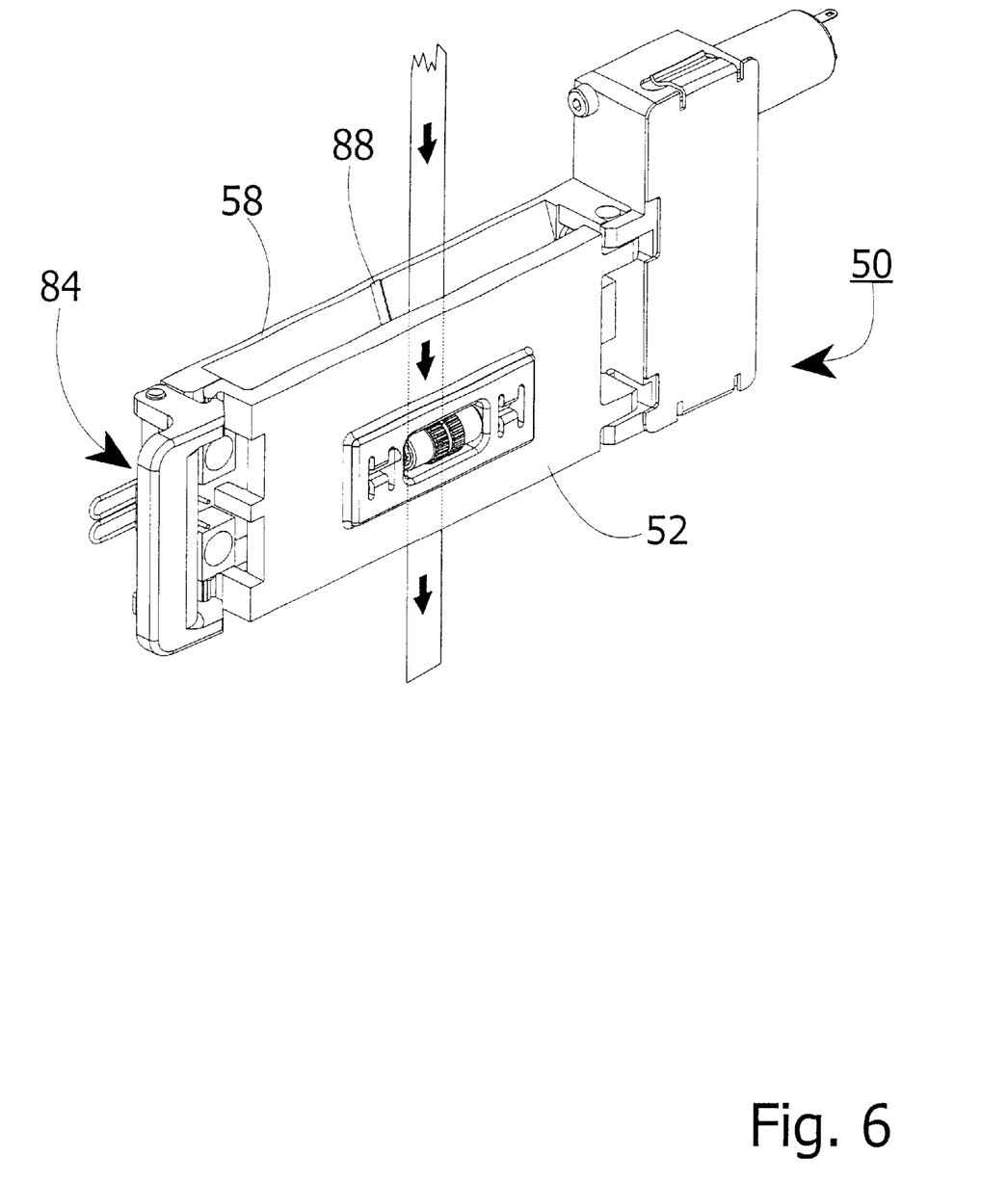
Figure 8:
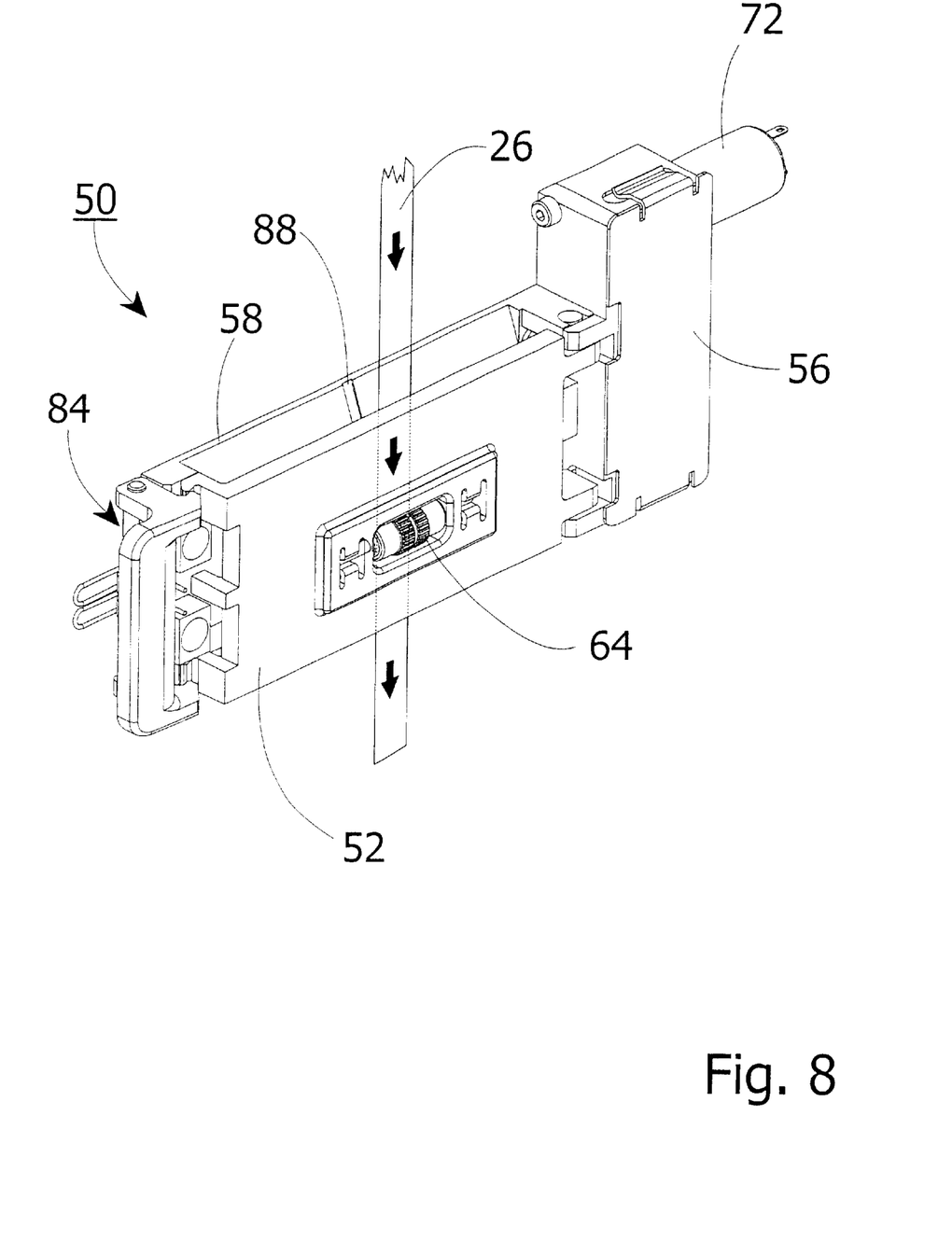

Referring specifically to FIGS. 6–8, the cover tape is "threaded" through the cover tape drive 50 by first releasing latch 84 and swinging lid 52 away from base 58. Once opened, as depicted in FIG. 7, the cover tape drive 50 has cover tape 26 placed down the center thereof so that the middle of the cover tape (between the two adhesive edges) is generally aligned with the O-ring 86. O-ring 86 is preferably an ethylene propylene ring having a durometer reading of approximately 90 and may be removable or replaceable, although other materials and durometer levels may also be employed. In particular, the appropriate alignment of the tape is indicated by notches 88, which may be viewed through the opaque tape as the operator swings the lid 52 into a closed position where it is once again latched by applying a slight force to the lid.

Referring, again, to FIG. 9, there is depicted an overview of the carrier and cover tape paths through the feeder 10. In particular, the carrier tape, with cover tape attached thereto, begins on roll 16 in carrier tape support 14. The exposed end of the carrier tape is advanced in the direction indicated by arrows 100 toward the pick location for retrieval of the components therein. Just prior to the pick location, peel edge 22 is employed to remove or peel the cover tape back from the surface of the carrier tape and to expose the components stored therein. Subsequent to the pick location 20, the empty carrier tape is advanced through a channel in the direction indicated by heavy dashed line 104 to a disposal output at the bottom of the feeder body.

In a similar manner, subsequent to being peeled, cover tape 26 continues to travel in the direction opposite the carrier tape, passing through the V-bar assembly 36 and then downward and behind the carrier tape to cover tape drive 50 where it is also directed to a disposal system or container located below the feeder.

In recapitulation, the present invention is a method and apparatus for supplying components, via a carrier tape having a cover tape thereon and a plurality of pockets retaining components therein, for retrieval by an automated insertion machine, including a carrier tape reel support, a tape feed path with a peel edge, about which to peel the cover tape from the carrier tape prior to the component being presented for retrieval at the pick location, and a cover tape path and drive system for directing the travel of the cover tape in a rearward and downward direction to facilitate disposal beneath the tape feeder.

It is, therefore, apparent that there has been provided, in accordance with the present invention, a method and apparatus for feeding continuous component carrier tapes having an improved cover tape path and a cover tape drive for reliably conveying cover tape removed from an upper surface of the carrier tape. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. An apparatus for supplying components, via a carrier tape having a cover tape thereon and a plurality of pockets retaining components therein, for retrieval by an automated insertion machine, comprising:
   a carrier tape reel support;
   a tape feed path and associated tape drive for sequentially positioning the carrier tape so that the components therein may be retrieved at a pick location;
   a peel edge, about which to peel the cover tape from the carrier tape prior to the component being presented for retrieval at the pick location;
   a cover tape path for controlling the travel of the cover tape in a rearward and downward direction so that the cover tape may be disposed; and
   a cover tape drive that includes:
      a lid having a knurled idler roller associated therewith:
      a motor; and
      a rotating drive shaft, coupled to said motor and positioned so that the end thereof extends to the center of the idler roller when the lid is closed, and where said drive shaft includes a removable O-ring mounted on the end thereof so that said O-ring contacts a surface of the cover tape and forms a drive nip with the knurled idler roller to impart a frictional drive force to the cover tape and move it through the cover tape drive.

2. The apparatus of claim 1, wherein the cover tape is threaded through the cover tape drive with an adhesive side of the cover tape facing the O-ring, when the lid is closed to engage the cover tape between the O-ring and the knurled idler roller.

3. The apparatus of claim 1, wherein the cover tape is threaded through the cover tape drive with an adhesive side of the cover tape facing the knurled idler roller, when the lid is closed to engage the cover tape between the O-ring and the knurled idler roller.

4. An apparatus for supplying components, via a carrier tape having a cover tape thereon and a plurality of pockets retaining components therein, for retrieval by an automated insertion machine, and a cover tape path comprising:
   a carrier tape reel support;
   a tape feed path and associated tape drive for sequentially positioning the carrier tape so that the components therein may be retrieved at a pick location;
   a peel edge, about which to peel the cover tape from the carrier tape prior to the component being presented for retrieval at the pick location; and
   a cover tape path for controlling the travel of the cover tape in a rearward and downward direction so that the cover tape may be disposed, wherein the cover tape path further includes a V-bar assembly to alter the direction of the cover tape and a friction cover tape drive.

5. The apparatus of claim 4, wherein the V-bar assembly includes:
   an angled rod; and
   a roller, wherein the rod and roller are maintained in a pre-determined angular relationship yet are pivotable about a common axis to facilitate threading of the cover tape therethrough.

6. A method of supplying components with a tape feeder, via a carrier tape having a cover tape thereon and a plurality of pockets retaining components therein, for retrieval by an automated insertion machine, comprising the steps of:
   supplying a spliceable source of the carrier tape;
   sequentially advancing the carrier tape with a tape drive, so that the components therein may be retrieved at a pick location;
   removing the cover tape from the carrier tape at a peel edge prior to the component being advanced to the pick location; and
   controlling the travel of the cover tape using a V-bar assembly to alter the direction and a friction cover tape drive, wherein the cover tape passes through the V-bar assembly to alter its direction of travel so as to be disposed of outside the tape feeder, wherein the step of controlling the travel of the cover tape using a V-bar assembly comprises the steps of passing the cover tape over the surface of an angled rod and a roller disposed at an acute angle to the rod in the V-bar assembly, and thereby altering the direction of travel of the cover tape by at least about ninety degrees.

7. The method of claim 6, comprising the step of passing the cover tape through a drive nip of the friction cover tape drive.

8. The method of claim 7, wherein the drive nip of the friction cover tape drive includes:
   a knurled idler roller; and
   a rotating drive shaft driven by a motor, said drive shaft having an O-ring mounted thereon at a position such that the O-ring is operatively adjacent the center of the idler roller, and where said O-ring contacts a surface of the cover tape and forms a drive nip with the idler roller to impart a frictional drive force to the cover tape and move it through the friction cover tape drive.

9. An apparatus for supplying components, via a carrier tape having a cover tape thereon and a plurality of pockets retaining components therein, for retrieval by an automated insertion machine, comprising:
   a peel edge, about which to peel the cover tape from the carrier tape prior to the component being presented for retrieval at the pick location; and
   a cover tape drive including,
      a lid having a knurled idler roller associated therewith,
      a motor, and
      a rotating drive shaft, coupled to said motor and positioned so that an O-ring mounted thereon contacts a surface of the cover tape and imparts a frictional drive force to the cover tape to move it through a tape drive nip formed between the O-ring and the idler roller.

10. The apparatus of claim 9, further comprising a V-bar assembly for guiding a cover tape, said V-bar assembly comprising:
   a rod oriented in a generally horizontal plane and angled with respect to a path of the cover tape; and
   a roller operatively associated with said rod, where said rod and roller are maintained in a pre-determined relationship as they pivot about a generally vertical axis to facilitate the threading of cover tape therethrough.

11. The apparatus of claim 10, wherein a longitudinal axis of said roller is placed an angle of at least about 45 degrees relative to a longitudinal axis of the rod.

12. The apparatus of claim 11, wherein the direction of travel of the cover tape is altered by at least about ninety degrees by the V-bar assembly as the tape passes therethrough.

13. The apparatus of claim 9, wherein the rotating drive shaft is of a length such that a non-driven end thereof extends at least to the center of the idler roller when drive is operational, and where said drive shaft includes an O-ring mounted on the end thereof so that said O-ring contacts a surface of the cover tape and imparts a frictional drive force.

* * * * *